United States Patent
Park et al.

(10) Patent No.: US 8,778,757 B2
(45) Date of Patent: Jul. 15, 2014

(54) METHODS OF MANUFACTURING A DRAM DEVICE

(75) Inventors: Jong-Chul Park, Hwaseong-si (KR); Sang-sup Jeong, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 127 days.

(21) Appl. No.: 13/540,996

(22) Filed: Jul. 3, 2012

(65) Prior Publication Data

US 2013/0011989 A1    Jan. 10, 2013

(30) Foreign Application Priority Data

Jul. 4, 2011   (KR) .................. 10-2011-0065875

(51) Int. Cl.
*H01L 21/8242*      (2006.01)

(52) U.S. Cl.
USPC ........... 438/256; 438/586; 438/587; 438/589; 438/696; 257/E21.627; 257/E21.649; 257/E21.655; 257/E21.658

(58) Field of Classification Search
USPC .................. 438/256, 586–587, 589, 696; 257/E21.627, E21.649, E21.655, 257/E21.658

See application file for complete search history.

(56) References Cited

U.S. PATENT DOCUMENTS

| | | | |
|---|---|---|---|
| 7,052,952 B2 | 5/2006 | Bae et al. | |
| 2010/0102371 A1* | 4/2010 | Yeom | 438/589 |
| 2010/0163976 A1* | 7/2010 | Lee et al. | 438/589 |

FOREIGN PATENT DOCUMENTS

| | | |
|---|---|---|
| KR | 0388475 | 7/2002 |
| KR | 0468784 | 8/2004 |
| KR | 20080084429 A | 9/2008 |

* cited by examiner

*Primary Examiner* — Mary Wilczewski
*Assistant Examiner* — Toniae Thomas
(74) *Attorney, Agent, or Firm* — Harness, Dickey & Pierce, P.L.C.

(57) ABSTRACT

In methods of manufacturing a DRAM device, a buried-type gate is formed in a substrate. A capping insulating layer pattern is formed on the buried-type gate. A conductive layer pattern filling up a gap between portions of the capping insulating layer pattern, and an insulating interlayer covering the conductive layer pattern and the capping insulating layer pattern are formed. The insulating interlayer, the conductive layer pattern, the capping insulating layer pattern and an upper portion of the substrate are etched to form an opening, and a first pad electrode making contact with a first pad region. A spacer is formed on a sidewall of the opening corresponding to a second pad region. A second pad electrode is formed in the opening. A bit line electrically connected with the second pad electrode and a capacitor electrically connected with the first pad electrode are formed.

20 Claims, 13 Drawing Sheets

METHODS OF MANUFACTURING A DRAM DEVICE

CROSS-REFERENCE TO RELATED APPLICATIONS AND CLAIM OF PRIORITY

This application claims priority under 35 U.S.C. §119(e) to Korean Patent Application No. 10-2011-0065875, filed on Jul. 4, 2011 in the Korean Intellectual Property Office, the contents of which are incorporated herein by reference in their entirety.

BACKGROUND

1. Field

Example embodiments relate to methods of manufacturing a dynamic random access memory (DRAM) device, and more particularly, to methods of manufacturing a DRAM device including a pad electrode making a contact with a substrate.

2. Related Art

As an integration degree of semiconductor devices increases, a size of a line width of patterns and a size of contact holes included in the semiconductor devices decrease. For a DRAM device, pad electrodes may be required to make contact with an active region of a substrate. In this case, because a width of the active region is small, a contacting area of the pad electrode with the active region may become very small. Accordingly, an increase of the contacting area between the pad electrode and the active region may be a difficult task without generating defects due to mis-alignment. In addition, a contacting characteristic of the pad electrode due to damage of the substrate in the contacting portion may deteriorate the pad electrode.

SUMMARY

Example embodiments relate to methods of manufacturing a dynamic random access memory (DRAM) device, and more particularly, to methods of manufacturing a DRAM device including a pad electrode making a contact with a substrate.

Some example embodiments provide methods of manufacturing a DRAM device including a pad electrode securing a contacting area, preventing damage in a contacting surface and having a good contacting characteristic.

According to an example embodiment, in a method of manufacturing a dynamic random access memory (DRAM) device, a buried-type gate is formed in a substrate including at least one first pad region and at least one second pad region. The buried-type gate extends in a first direction. A capping insulating layer pattern is formed on (or, alternatively, over) the buried-type gate. The capping insulating layer pattern extrudes above (or, protrudes from) the substrate. A conductive layer pattern filling up a gap between portions of the capping insulating layer pattern is formed. The conductive layer pattern contacts a surface of the substrate. An insulating interlayer covering (or, alternatively, over) the conductive layer pattern and the capping insulating layer pattern is formed. The insulating interlayer, the conductive layer pattern, the capping insulating layer pattern and an upper portion of the substrate are etched to form an opening extending in the first direction and to form a first pad electrode having an island (or, isolated) shape. The first pad electrode contacts the first pad region of the substrate. A first spacer is formed on a sidewall of the opening portion such that a gap remains in an inner portion of the opening corresponding to the second pad region of the substrate and a remaining portion of the opening is completely filled. A second pad electrode is formed in the gap remaining in the inner portion of the opening. A bit line electrically connected to the second pad electrode, and a capacitor electrically connected to the first pad electrode, are formed.

In some example embodiments, the forming a buried-type gate may include the following steps. A first mask pattern may be formed on (or, alternatively, over) the substrate. The substrate may be etched using the first mask pattern as an etching mask to form a trench. A gate insulating layer may be formed on an inner wall of the trench. A conductive layer may be formed on (or, alternatively, over) the gate insulating layer to fill up the trench. The conductive layer may be etched (or, etched back) to form the buried-type gate filling up a lower portion of the trench.

In some example embodiments, the forming of a capping insulating layer pattern may include the following steps. A capping insulating layer may be formed on (or, alternatively, over) the buried-type gate to completely fill up a remaining portion of the trench. The capping insulating layer may be polished to expose an upper surface of the first mask pattern and to form the capping insulating layer pattern. The first mask pattern may be removed.

In some example embodiments, the capping insulating layer may be formed using a material having a different etching selectivity than the first mask pattern.

In some example embodiments, the opening may have a line shape extending in the first direction. The opening may have a first width over a region of the substrate excluding the second pad region and a second width greater than the first width in the second pad region of the substrate.

In some example embodiments, the forming of a first spacer may include the following steps. A spacer layer filling up the opening over the region of the substrate excluding the second pad region and partially filling the opening over the second pad region may be formed. The spacer layer may have a hole partially exposing the second pad region of the substrate. Then, the spacer layer may be anisotropically etched.

In some example embodiments, the spacer layer may have a thickness greater than a half of the first width and smaller than a half of the second width.

In some example embodiments, the forming of a first pad electrode may include the following steps. A second mask pattern may be formed on (or, alternatively, over) the insulating interlayer. The second mask pattern may extend in a second direction substantially perpendicular to the first direction, and may cover the first pad region and may expose the second pad region. The insulating interlayer, the conductive layer pattern, the capping insulating layer pattern and an upper portion of the substrate may be etched by using the second mask pattern as an etching mask.

In some example embodiments, forming an active region on the substrate may be further performed. The active region may have an isolated (or, island) shape, and the active region may be formed at an angle other than 90 degrees with respect to the first direction.

In some example embodiments, the forming of a conductive layer pattern may include the following steps. A conductive layer may be formed on the capping insulating layer pattern. The conductive layer may fill up the gap between portions of the capping insulating layer pattern. The conductive layer may be polished to expose an upper surface of the capping insulating layer pattern.

In some example embodiments, the conductive layer pattern may include a polysilicon material.

In some example embodiments, an upper surface of the capping insulating layer pattern may be equal to, or higher than, that of a target pad electrode to be formed.

In some example embodiments, the first spacer may include silicon nitride.

In some example embodiments, the active region may include first pad regions at both edge portions and a second pad region at a center portion in an extending direction of the active region.

In some example embodiments, the forming of a bit line may include the following steps. A second conductive layer may be formed on the substrate including the first and second pad electrodes. A hard mask may be formed on the second conductive layer. The second conductive layer may be etched using the hard mask to form a bit line structure extending in a second direction substantially perpendicular to the first direction. The bit line structure may contact the second pad electrode. A second spacer may be formed at both sides of the bit line structure.

According to another example embodiment, a method of manufacturing a dynamic random access memory (DRAM) device includes forming an insulated gate structure over a substrate. The insulated gate structure includes a buried-type gate within the substrate, a first capping insulating layer pattern over the buried-type gate and partially recessed in the substrate, and a conductive layer pattern along sidewalls of the first capping insulating layer pattern. The buried-type gate extends in a first direction. A preliminary first pad electrode and a second capping insulating layer pattern are formed by etching the insulated gate structure and an upper portion of the substrate. A first pad electrode is formed contacting a first pad region of the substrate by patterning the preliminary first pad electrode along a second direction substantially perpendicular to the first direction to expose a second pad region of the substrate. A spacer is formed on sidewalls of the first pad electrode and the second capping insulating layer pattern, and the spacer is formed partially over the exposed second pad region such that a portion of the second pad region remains exposed. A second pad electrode is formed over the exposed portion of the second pad region. The first pad electrode is isolated from the second pad electrode. A bit line structure is electrically connected to the second pad electrode. A capacitor is electrically connected to the first pad electrode.

In some example embodiments, the first pad region and the second pad region may be alternately arranged along the first direction.

In some example embodiments, the forming the first pad electrode may comprise forming an opening portion extending in the second direction. The opening portion may have a first width over a region of the substrate excluding the second pad region, and a second width over the second pad region. The second width may be greater than the first width. The first and the second widths of the opening portion may extend in the first direction.

In some example embodiments, the forming the spacer comprises forming a spacer layer along a sidewall of the opening portion and on an upper surface of the substrate, the spacer layer exposing the portion of the second pad region. The spacer layer may be etched to form the spacer. The spacer may cover the region of the substrate excluding the second pad region and partially covering the second pad region.

In some example embodiments, the conductive layer pattern may be shaped as a line extending in the first direction.

As described above, a pad electrode may be formed by patterning a conductive layer pattern having a line shape in accordance with example embodiments. Accordingly, misalignment at a contacting surface may be prevented and a contacting area may be secured. In addition, a generation of damage in the contacting surface may be prevented. A pad electrode having a good contacting characteristic may be formed. A DRAM device having a high integration and a good operating characteristic may be manufactured.

BRIEF DESCRIPTION OF THE DRAWINGS

Example embodiments will be more clearly understood from the following detailed description taken in conjunction with the accompanying drawings.

FIGS. 1 to 5 are perspective views for explaining a method of forming a pad electrode structure included in a DRAM device in accordance with an example embodiment.

FIGS. 6 to 24 are cross-sectional views, plan views and perspective views for explaining a method of manufacturing a DRAM device in accordance with another example embodiment.

FIG. 25 is a plan view of a memory module including a DRAM chip having a DRAM device in accordance with yet another example embodiment.

FIG. 26 is a block diagram of an electronic system including a DRAM chip having a DRAM device in accordance with still another example embodiment.

DETAILED DESCRIPTION OF THE EXAMPLE EMBODIMENTS

Figure 1:
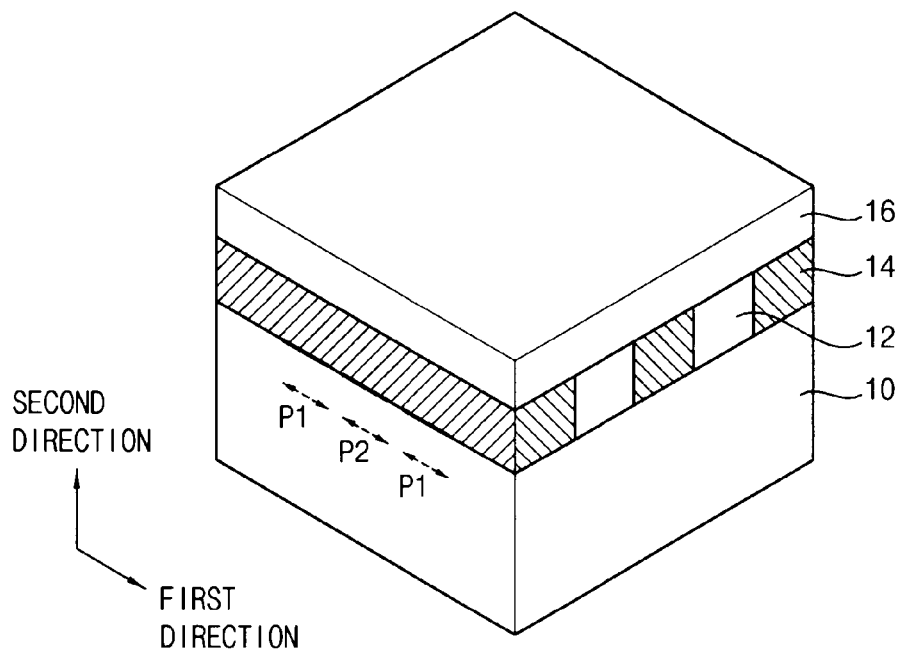
FIGS. 1 to 26 represent example embodiments as described herein.

Various example embodiments will be described more fully hereinafter with reference to the accompanying drawings, in which some example embodiments are shown. The examples may, however, be embodied in many different forms and should not be construed as limited to the example embodiments set forth herein. Rather, these example embodiments are provided so that this description will be thorough and complete, and will fully convey the scope to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Example embodiments relate to methods of manufacturing a dynamic random access memory (DRAM) device, and more particularly, to methods of manufacturing a DRAM device including a pad electrode making a contact with a substrate.

Hereinafter, methods of manufacturing a DRAM device in accordance with example embodiments will be explained in detail.

FIGS. 1 to 5 are perspective views for explaining a method of forming a pad electrode structure included in a DRAM device in accordance with an example embodiment.

Referring to FIG. 1, a substrate 10 including a first pad region P1 and a second pad region P2 may be prepared. Each of the first and second pad regions P1 and P2 may have an isolated (or, island) island shape and may be disposed parallel to each other in a first direction.

A first insulating layer (not shown) may be formed on the substrate 10 and then, patterned to form a preliminary first insulating layer pattern 12. The preliminary first insulating layer pattern 12 may have a line shape extending in the first direction. The preliminary first insulating layer pattern 12 may be formed using silicon oxide.

A conductive layer (not shown) filling up gaps between portions of the preliminary first insulating layer pattern 12 may be formed on the preliminary first insulating layer pattern 12. The conductive layer may include polysilicon material. An upper surface portion of the conductive layer may be polished to form a first conductive layer pattern 14 between portions of the preliminary first insulating layer pattern 12. Accordingly, the preliminary first insulating layer pattern 12 and the first conductive layer pattern 14 having a line shape and extending in the first direction may be alternately formed on the substrate 10.

A second insulating layer 16 may be formed on the preliminary first insulating layer pattern 12 and the first conductive layer pattern 14. The second insulating layer 16 may be formed by depositing silicon oxide.

Figure 2:
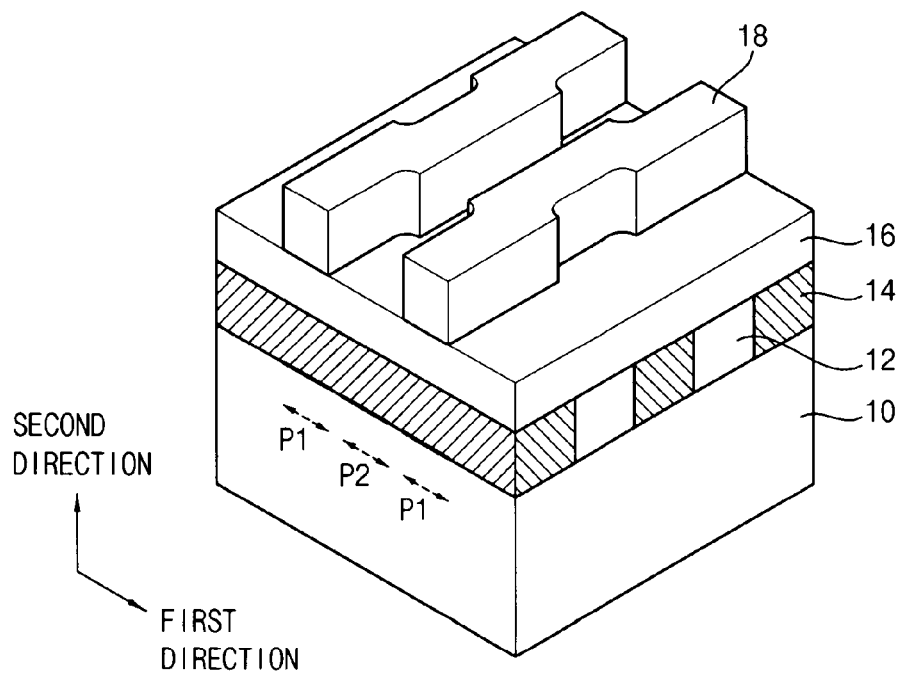

Referring to FIG. 2, a mask layer (not shown) may be formed on the second insulating layer 16. The mask layer may be patterned to form a mask pattern 18 having a line shape and extending in a second direction substantially perpendicular to the first direction.

The mask pattern 18 may cover an upper portion of the first pad region P1 and may have a line shape extending in the first direction. In addition, the mask pattern 18 may expose an upper portion of the second pad region P2.

Between portions of the mask pattern 18, a gap in the second pad region P2 may be wider than that in other regions as illustrated in FIG. 2.

Figure 3:
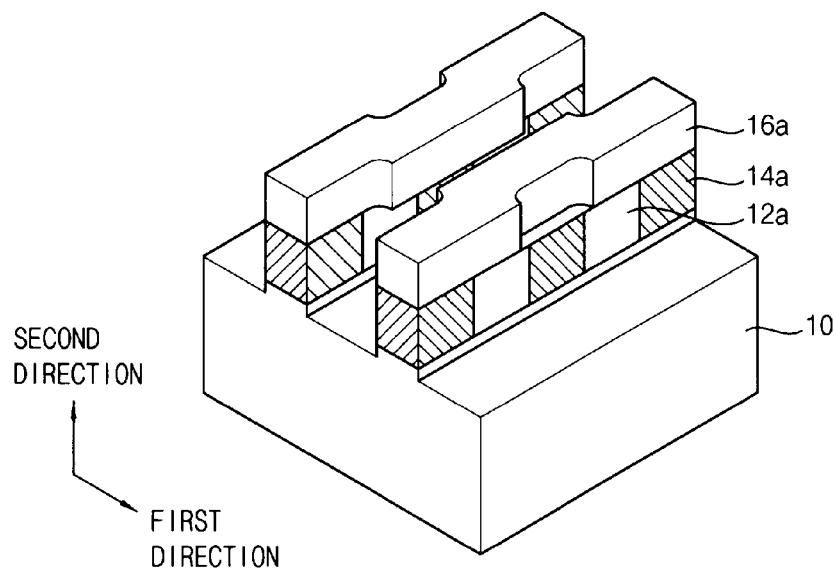

Referring to FIG. 3, the second insulating layer 16, the first conductive layer pattern 14 and the preliminary first insulating layer pattern 12 may be etched using the mask pattern 18 as an etching mask. In addition, a portion of an upper portion of the substrate 10 under the first conductive layer pattern 14 and the preliminary first insulating layer pattern 12 may be etched.

After performing the etching process, the first conductive layer pattern 14 may be cut in the second direction to form a first pad electrode 14a having an isolated (or, island) shape. The first pad electrode 14a may have a shape that contacts (e.g., surface-to-surface contact) a first pad region P1. In addition, the preliminary first insulating layer pattern 12 may become a first insulating layer pattern 12a having an isolated (or, island) shape.

In addition, a second insulating layer pattern 16a may be formed by the etching process along with the first insulating layer pattern 12a.

Because the upper surface portion of the substrate 10 under the first conductive layer pattern 14 may be etched along with the first conductive layer pattern 14 while forming the first pad electrode 14a, the first conductive layer pattern 14 may be completely cut in the second direction. Accordingly, defects including a stringer defect due to a connection of the first pad electrodes 14a with each other by a portion of the remaining first conductive layer pattern 14 in the second direction may be prevented.

Then, the mask pattern 18 may be removed.

Figure 4:
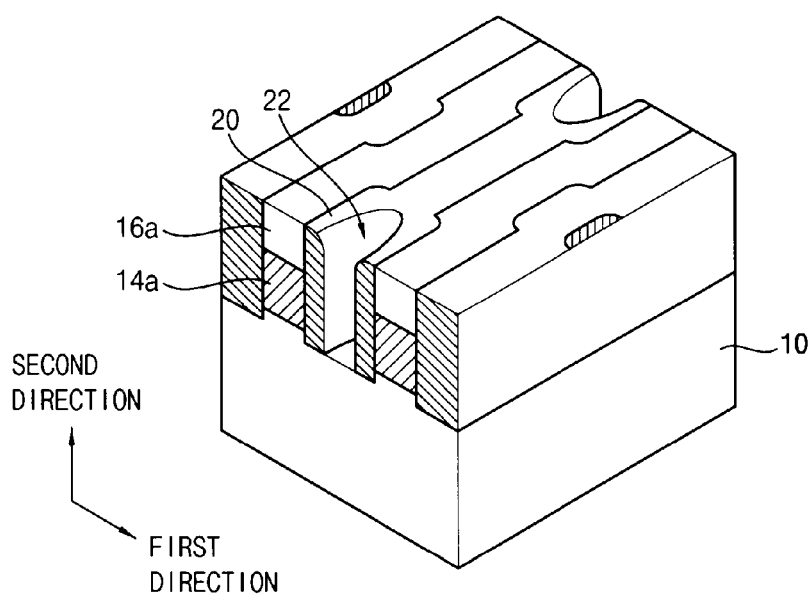

Referring to FIG. 4, a spacer layer (not shown) may be formed along a sidewall and a bottom portion of an opening portion formed while performing the etching process, and along an upper surface portion of the second insulating layer pattern 16a.

At a portion having a wide width and corresponding to the second pad region in the opening portion, the spacer layer may be formed on the sidewall of the opening portion. A hole portion 22 may remain after forming the spacer layer in the second pad region.

At a portion having a narrow width and corresponding to a region excluding the second pad region in the opening portion, the spacer layer may be formed to completely fill up the inner gap portion of the opening portion.

The spacer layer may be anisotropically etched to form a spacer 20 on the sidewall of the hole portion 22. At the bottom portion of the hole portion 22, the substrate 10 corresponding to the second pad region may be exposed.

Figure 5:
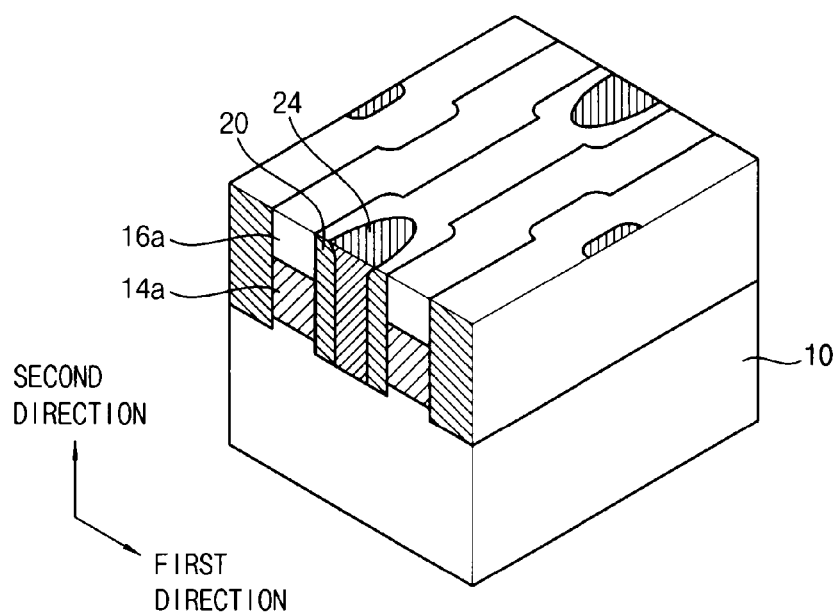

Referring to FIG. 5, a second conductive layer (not shown) filling up the inner portion of the hole portion 22 may be formed. The second conductive layer may be polished, or etched back, to expose an upper surface portion of the second insulating layer pattern 16a and to form a second pad electrode 24.

In accordance with the above-described method, a process for forming an opening portion by vertically etching the first pad region may not be performed for forming the first pad electrode 14a. Accordingly, a damage of the substrate 10 at the first pad region may be prevented while forming the first pad electrode 14a.

In addition, because the substrate 10 under the first conductive layer pattern 14 may be over-etched while forming the first pad electrode 14a, a generation of defects due to remaining portion of the first conductive layer pattern 14 at the bottom portion may be prevented.

FIGS. 6 to 24 are cross-sectional views, plan views and perspective views for explaining a method of manufacturing a DRAM device in accordance with another example embodiment.

Figure 7:
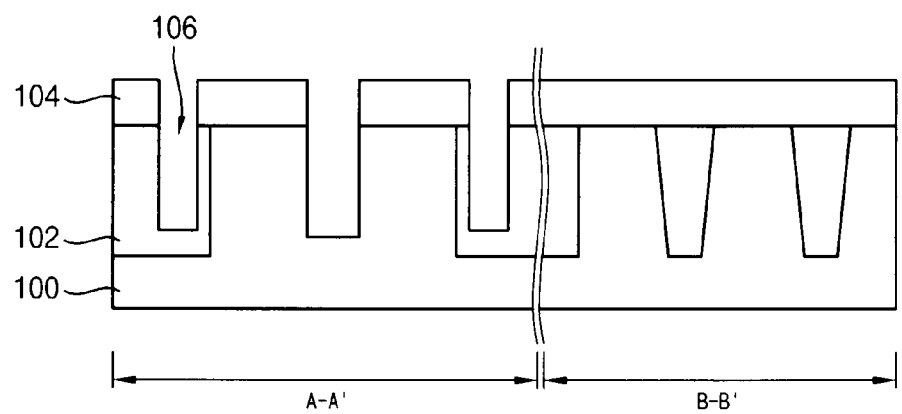
Figure 8:
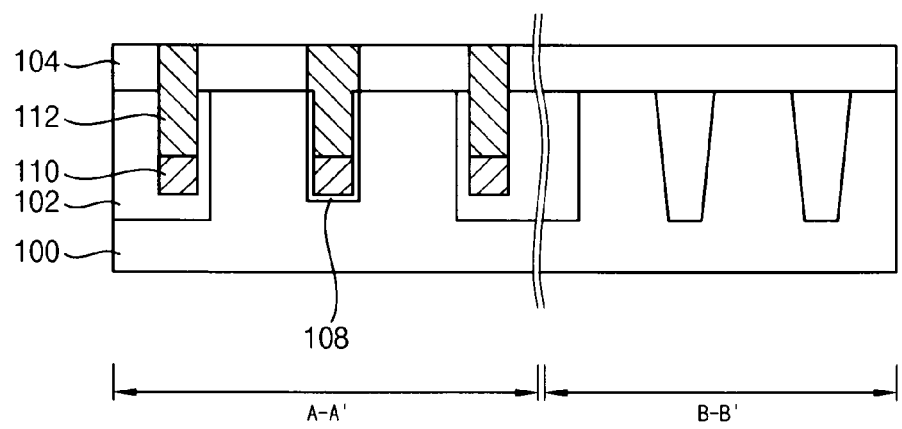
Figure 9:
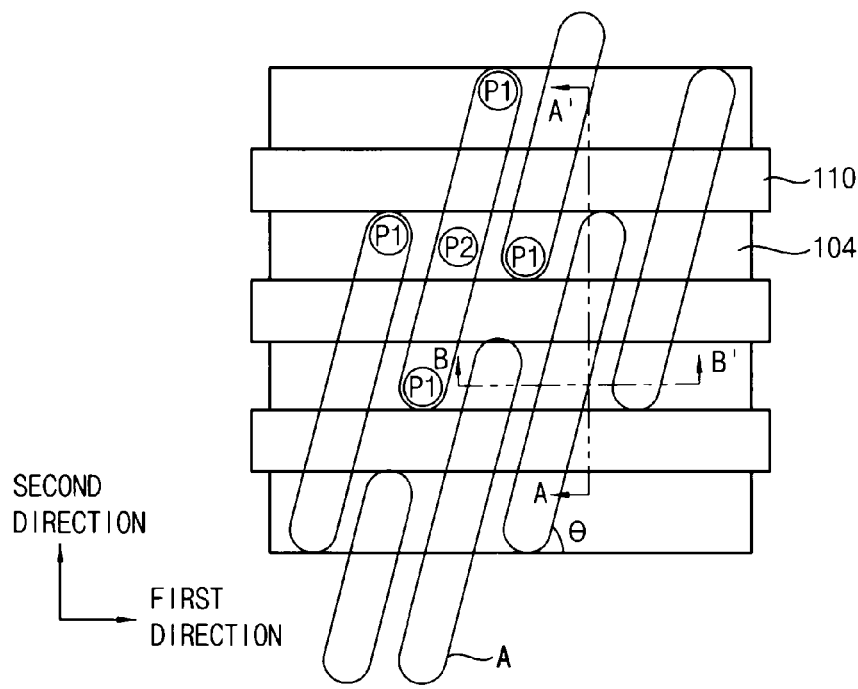

In the cross-sectional views of FIGS. 6 to 8, 10, 11 and 13, left portions are cross-sectional views when cutting along a line A-A' in FIG. 9 and right portions are cross-sectional views when cutting along a line B-B' in FIG. 9.

Figure 6:
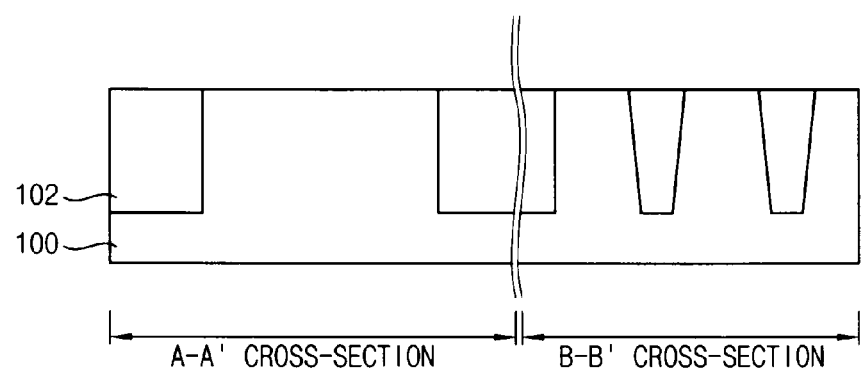

Referring to FIG. 6, a device isolation region of a substrate 100 may be etched to form a trench for device isolation. The inner portion of the trench for the device isolation may be filled up with an insulating material to form a device isolation layer pattern 102. An active region and the device isolation region may be separated in the substrate 100 by the device isolation layer pattern 102.

Source/drain regions (not shown) may be formed by doping impurities into an upper surface portion of the substrate 100. An upper portion of the source/drain regions may be highly doped, and a lower portion of the source/drain regions may be lightly doped by controlling a concentration of the impurities.

Referring to a plan view illustrated in FIG. 9, the active regions A may have an isolated (or, island) shape and may be disposed repeatedly. The active regions A may be disposed while forming a buried-type gate at an angle θ with respect to the first direction in a following process. However, the active regions A may not make a 90 degree angle to the first direction.

As described above, both edge portions of each active region A with reference to an extending direction of the isolated active region A may become first pad regions P1. In addition, a center portion of each active region A with reference to an extending direction of the isolated active region A may become a second pad region P2. The second pad region P2 may be provided between two of the first pad regions P1 when observing the disposed relation in the first direction. The second pad region P2 in the extending direction of the active region A may face the first pad regions P1 of the neighboring active regions A in the first direction.

Referring to FIG. 7, a first mask layer (not shown) may be formed on the substrate 100. The first mask layer may be formed by depositing silicon oxide, etc. The first mask layer may be patterned to form a first mask pattern 104.

The first mask pattern 104 may be formed to have the same thickness as, or higher thickness than, a height of a first pad electrode to be formed in a following process. The first mask pattern 104 may have a shape extending in the first direction.

The exposed portion of the substrate 100 in the active region and the device isolation region may be etched using the first mask pattern 104 as an etching mask to form trenches 106.

Referring to FIG. 8, a gate insulating layer 108 may be formed on an inner wall of the trench 106. The gate insulating layer 108 may be formed using silicon oxide. The silicon oxide may be obtained through a thermal oxidation process. Alternatively, the gate insulating layer 108 may be formed using a material having a high dielectricity.

On the gate insulating layer 108, a polysilicon layer may be formed. Inner portion of the trenches 106 may be completely filled with polysilicon through the forming process of the polysilicon layer.

An etch back process may be performed with respect to the polysilicon layer on the substrate 100. Through performing the etch back process, the polysilicon layer on the first mask pattern 104 may be removed and the polysilicon on inner and bottom portions of the trenches 106 may remain. The polysilicon remaining on the inner and bottom portions of the trenches 106 may become a buried-type gate electrode 110. An upper surface portion of the remaining polysilicon after performing the etch back process (i.e., a upper surface portion of the buried-type gate electrode 110) may be positioned lower than a surface portion of the substrate 100 in the active region A.

Through the above-described process, the buried-type gate electrode 110 crossing each of the active regions A may be formed as illustrated in FIG. 9. The buried-type gate electrode 110 may have a shape extending in the first direction. Two of the buried-type gate electrodes 110 may be provided in one of the isolated active regions A. In addition, the buried-type gate electrode 110 may be formed in the isolated active region between the first pad region P1 and the second pad region P2 to separate the first and second pad regions P1 and P2.

After that, a capping insulating layer (not shown) filling up an inner portion of the trenches 106 and covering the first mask pattern 104 may be formed. The capping insulating layer may be formed using a material having an etching selectivity with respect to the first mask pattern 104. Particularly, the capping insulating layer may be formed by depositing silicon nitride.

The capping insulating layer may be polished to expose an upper surface portion of the first mask pattern 104 and to form a first capping insulating layer pattern 112. The first capping insulating layer pattern 112 may have a line shape extending in the first direction and may be formed between portions of the first mask pattern 104. Accordingly, portions of the first mask pattern 104 and portions of the first capping insulating layer pattern 112 may be alternately formed on the surface portion of the substrate 100.

An upper surface portion of the first capping insulating layer pattern 112 may be substantially at the same level as the upper surface portion of the first mask pattern 104. Accordingly, the height of the first capping insulating layer pattern 112 may be the same as, or higher than, the height of the first pad electrode to be formed in a following process.

Figure 10:
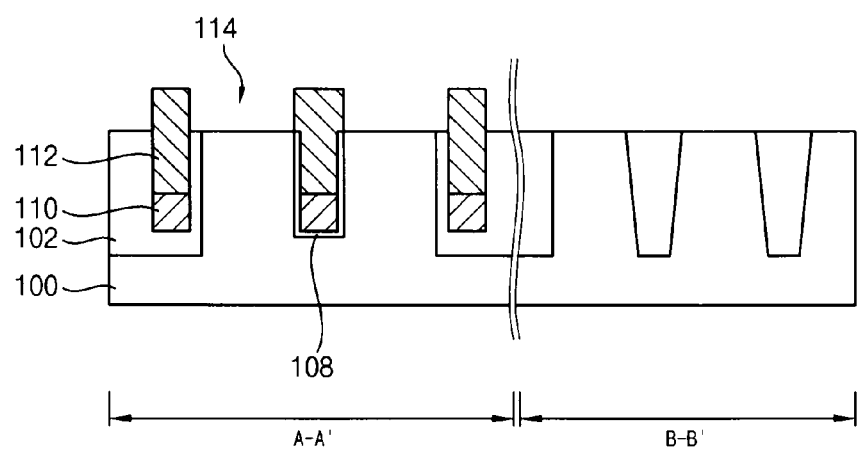

Referring to FIG. 10, the first mask pattern 104 may be selectively removed to expose the surface portion of the substrate 100. The removal of the first mask pattern 104 may include performing a wet etching process. After removing the first mask pattern 104 by the wet etching process, the surface portion of the substrate 100 may not be subjected to plasma. Accordingly, damage on the surface portion of the substrate 100 may be prevented while forming an opening portion 114 extending in the first direction.

Figure 11:
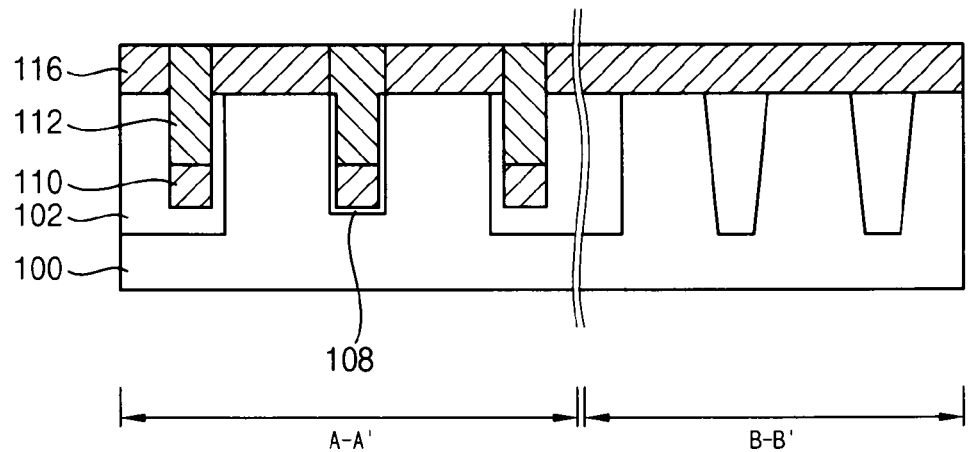
Figure 12:
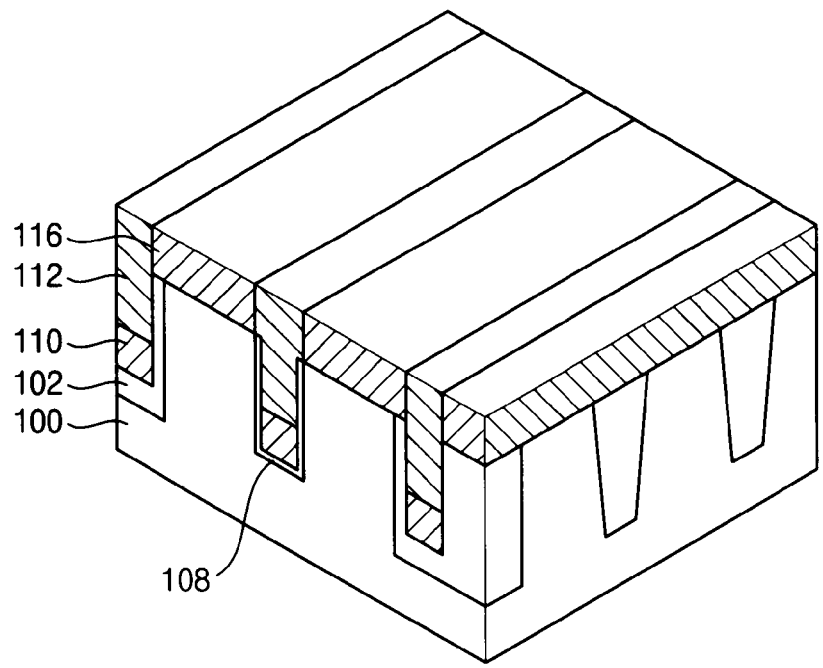

Referring to FIGS. 11 and 12, a conductive layer (not shown) filling up the opening portion 114 between portions of the first capping insulating layer pattern 112 may be formed. The conductive layer may become a first pad electrode through performing a following process. Particularly, the conductive layer may be formed by depositing polysilicon.

The conductive layer may be polished to expose an upper surface portion of the first capping insulating layer pattern 112 and to form a first conductive layer pattern 116.

After performing the above-described process, the first conductive layer pattern 116 may have a line shape extending in the first direction. At both sides of the first conductive layer pattern 116, portions of the first capping insulating layer pattern 112 may be provided.

Figure 13:
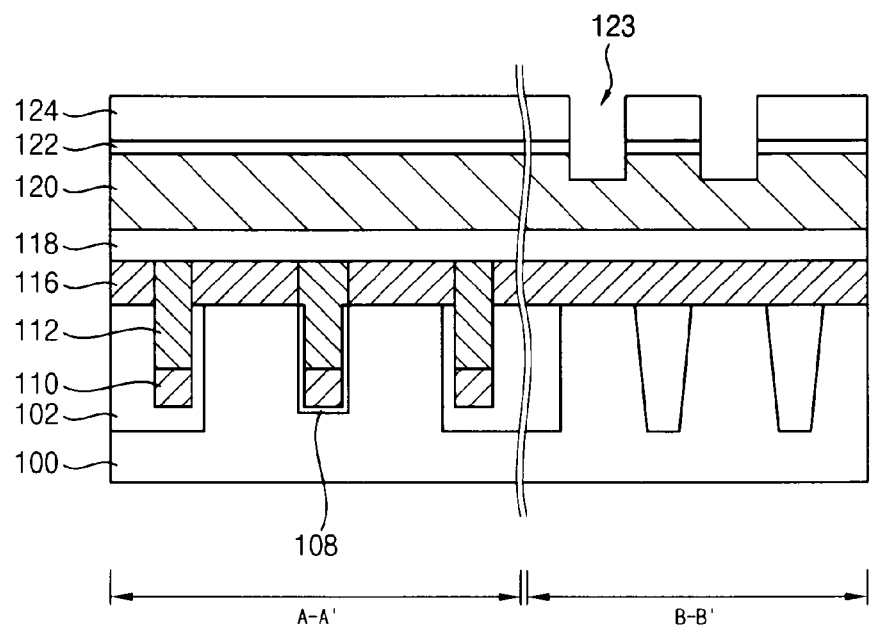

Referring to FIG. 13, an insulating interlayer 118 may be formed on the first capping insulating layer pattern 112 and the first conductive layer pattern 116. The insulating interlayer 118 may be formed by depositing silicon oxide.

On the insulating interlayer 118, a second mask layer 120 and a third mask layer (not illustrated) may be formed. The second mask layer 120 may be formed as a spin-on hard mask layer, or a carbon spin-on hard mask layer. The second mask layer 120 may be used as a practical etching mask for etching underlying layers. The third mask layer may be formed by depositing silicon oxynitride ($SiO_xN_y$) or silicon nitride ($SiN_x$).

On the third mask layer, a photoresist may be coated to form a photoresist layer (not illustrated). The photoresist layer may be formed to have a required thickness by controlling a coating recipe of the photoresist. An exposing process and a developing process may be performed to form a first photoresist pattern 124 having a line shape extending in the second direction which is perpendicular to the first direction.

Figure 14:
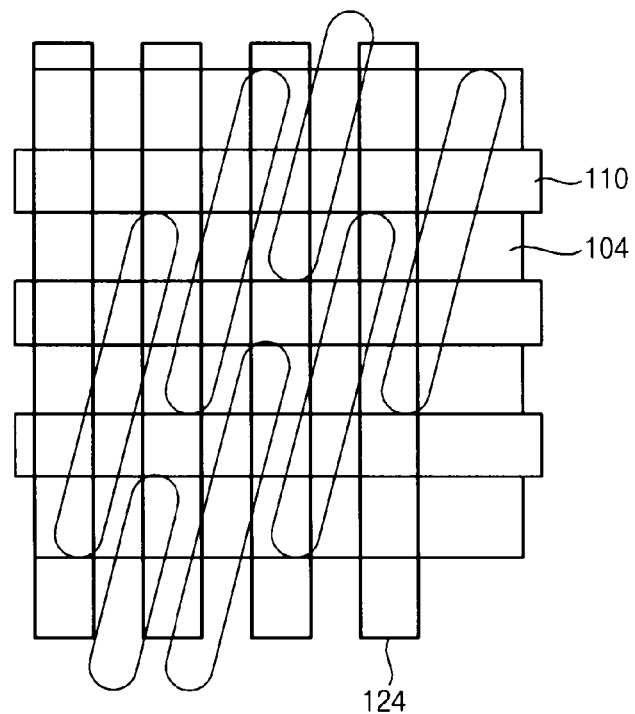

FIG. 14 is a plan view for illustrating a forming portion of the first photoresist pattern.

The third mask layer may be etched using the first photoresist pattern 124 as an etching mask. Through performing the etching process, a preliminary third mask pattern 122 may be formed. In this case, a portion of an upper portion of the second mask layer 120 may be etched. Then, the first photoresist pattern may be removed. An opening 123 may be formed through performing the above-described process.

Figure 15:
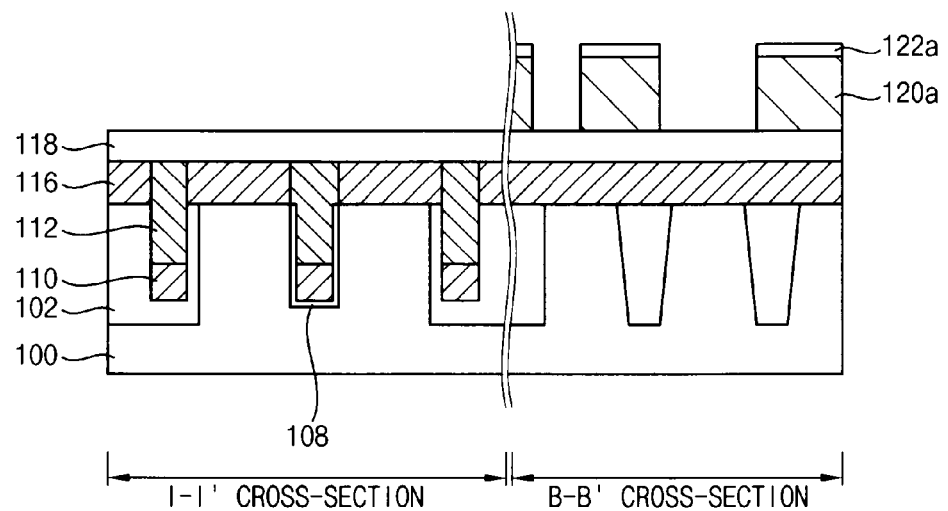
Figure 16:
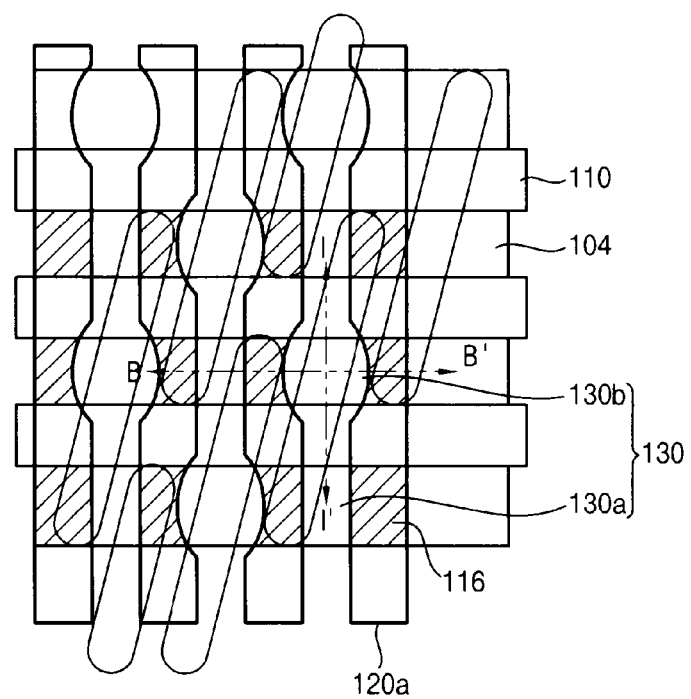

In the cross-sectional views illustrated in FIGS. 15, 17, 19, 21, 23 and 24, left portions may be obtained by cutting along a line I-I', and right portions may be obtained by cutting along a line B-B' in FIG. 16.

Referring to FIG. 15, a photoresist layer (not shown) may be coated on the substrate 100 including the preliminary third mask pattern 122. Then, the photoresist layer may be patterned through an exposing process and a developing process to form a second photoresist pattern (not illustrated). The second photoresist pattern may expose an upper portion of the second pad region P2. The preliminary third mask pattern 122 may be etched using the second photoresist pattern as an etching mask to form a third mask pattern 122a. The third mask pattern 122a may have a line shape extending in the first direction. In addition, opening portions extending in the first direction may be formed between portions of the third mask pattern 122a. The opening portions may have a wider gap at an overlapping portion with the second pad region.

The second photoresist pattern may be removed.

The second mask layer 120 may be etched using the third mask pattern 122a to form a second mask pattern 120a. The second mask pattern 120a and the third mask pattern 122a may have the same shape as illustrated in FIG. 16.

Most of the third mask pattern 122a may be removed while forming the second mask pattern 120a even though not illustrated.

Figure 17:
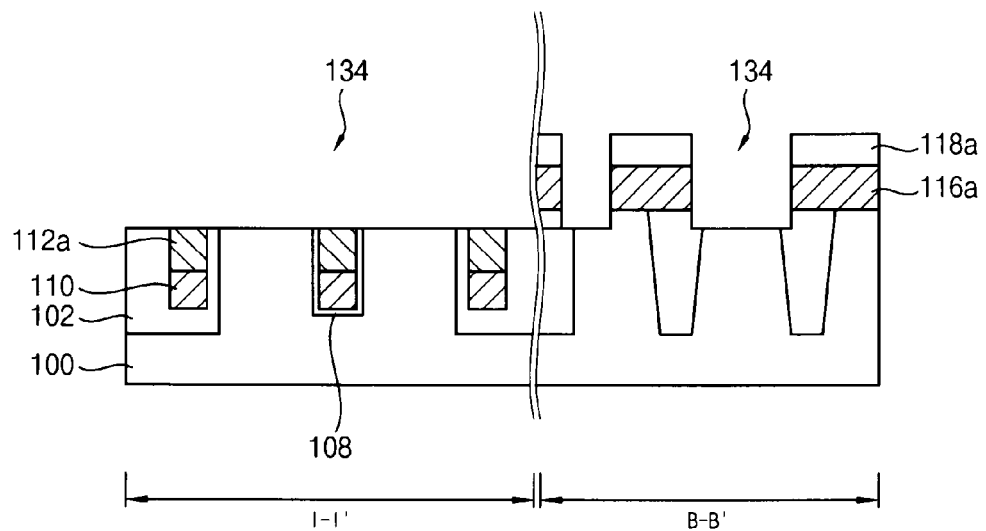

Referring to FIGS. 16 and 17, the insulating interlayer 118, the first conductive layer pattern 116 and the first capping insulating layer pattern 112 may be etched one by one using the second mask pattern 120a as an etching mask to form an insulating interlayer pattern 118a, a preliminary first pad electrode (not shown) and a second capping insulating layer pattern 112a. Then, the exposed portion of the substrate 100 under the first conductive layer pattern 116 may be etched.

After performing the etching process, the preliminary first pad electrode may be cut in the second direction to form a first pad electrode 116a having an isolated (or, island) shape. In this case, the etching process may be performed to over etch an upper portion of the substrate 100 under the first conductive layer pattern 116. Accordingly, problems of remaining a conductive material residue under the first conductive pattern 116 may not be generated.

In addition, a forming process of a contact hole and a process of filling up a conductive material in the contact hole may not be performed while performing the forming process of the first pad electrode. Accordingly, a problem, which is observed when a decrease in a contacting area due to misalignment frequently generated while forming the contact hole, may not be generated. Therefore, the first pad electrode may secure a sufficient contacting area. In addition, plasma damage on a surface of a substrate and a recess problem on the surface of the substrate generated while forming the contact hole may not be generated. Accordingly, the first pad electrode having a good contacting characteristic may be formed.

Figure 18:
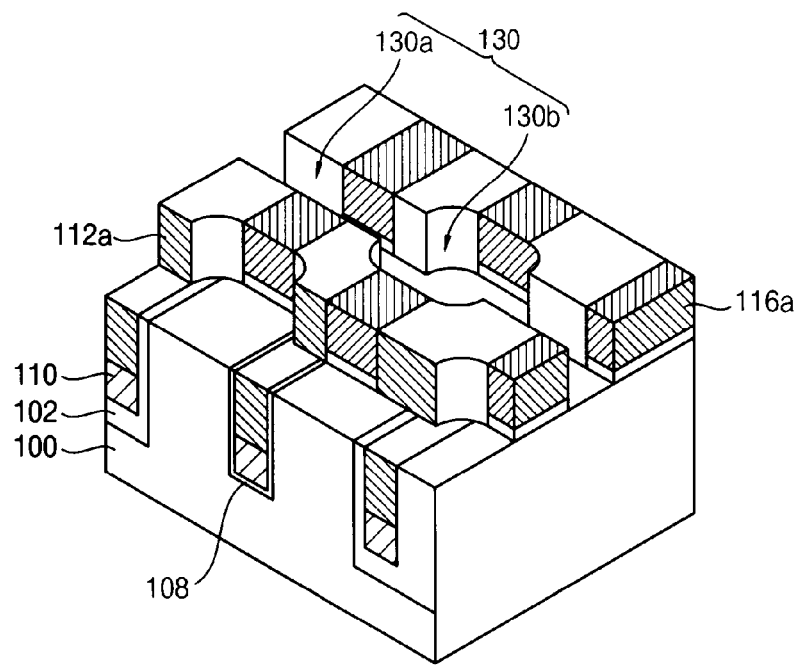

FIG. 18 is a perspective view for illustrating a shape of the first pad electrode formed after performing the etching process.

Even though an insulating interlayer may be provided on the first pad electrode and the first capping insulating layer pattern, the insulating interlayer pattern has been omitted in FIG. 18 for an explanation of the shape of the first pad electrode.

Referring to FIG. 18, the first pad electrode 116a having an isolated (or, island) shape and making contact with the first pad region may be formed.

In addition, the insulating interlayer 118 and the first capping insulating layer pattern 112 may be patterned to form the insulating interlayer pattern 118a and the second capping insulating layer pattern 112a, respectively.

On the substrate 100, the second capping insulating layer pattern 112a and the first pad electrode 116a may be formed. On the second capping insulating layer pattern 112a and the first pad electrode 116a, the insulating interlayer pattern 118a may be formed as an integrated structure.

Between the structures, opening portions 130a and 130b extending in the first direction may be formed as illustrated in FIG. 16. In the opening portions 130a and 130b, the opening portion 130b corresponding to the second pad region may have a relatively wide gap.

Figure 19:
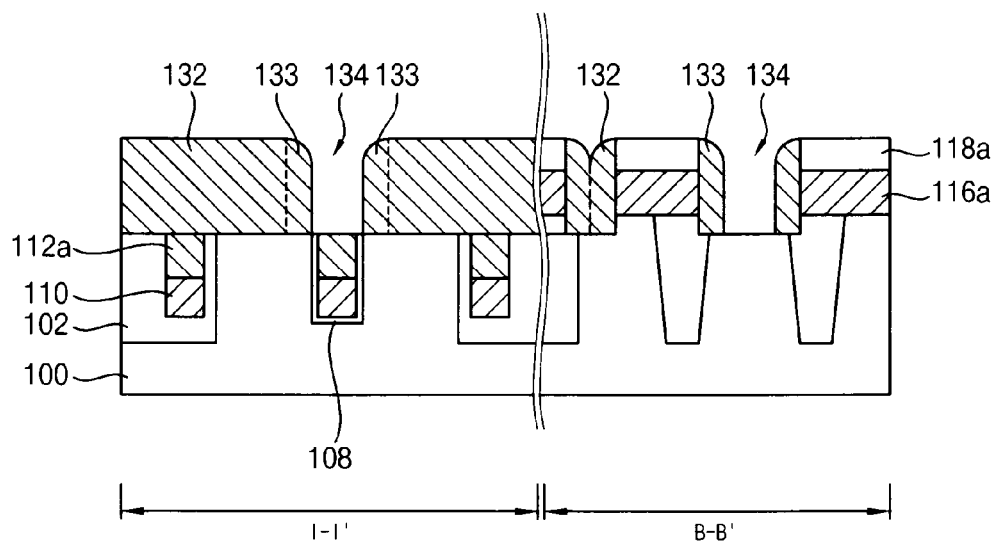
Figure 20:
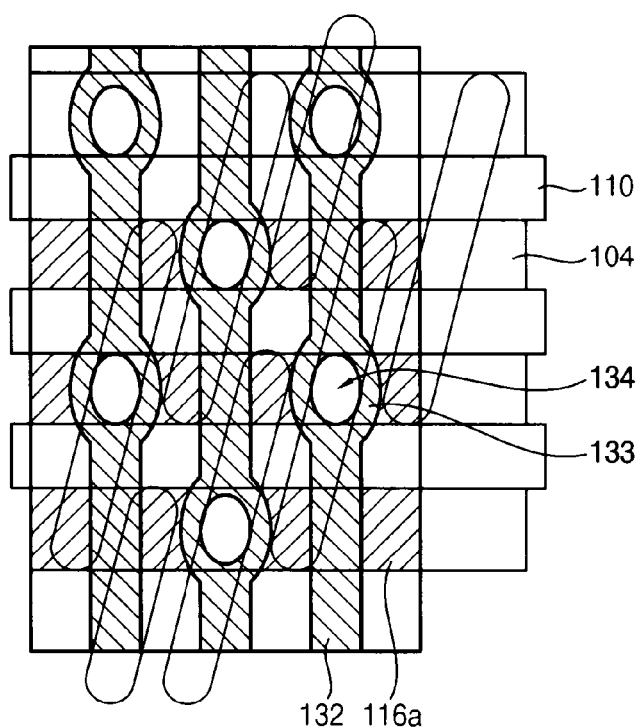

Referring to FIGS. 19 and 20, a spacer layer 132 may be formed along a sidewall and a bottom portion of the opening portions 130a and 130b, and along an upper surface portion of the insulating interlayer pattern 118a.

On the sidewall of the opening portion 130b having a wide width corresponding to the second pad region among the opening portions 130a and 130b, the spacer layer 132 may be formed. In the second pad region, a hole portion 134 may remain after forming the spacer layer 132.

The opening portion 130a having a narrow width (excluding the region corresponding to the second pad region among the opening portions 130a and 130b) may be filled up with the spacer layer 132.

The spacer layer 132 may be anisotropically etched to form a spacer 133 on a sidewall of the hole portion 134. After performing the etching process, the substrate 100 corresponding to the second pad region may be exposed through a bottom portion of the hole portion 134.

Figure 21:
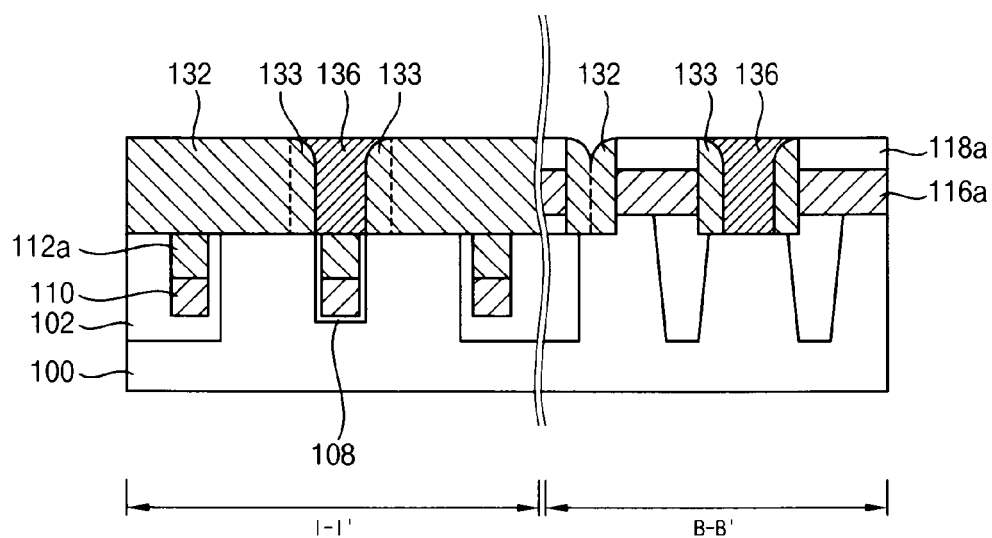
Figure 22:
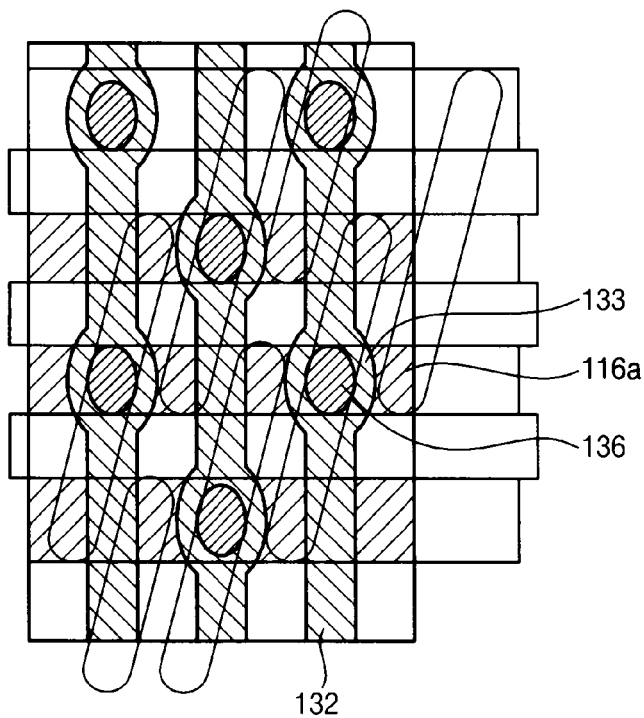

Referring to FIGS. 21 and 22, a second conductive layer (not shown) filling up an inner portion of the hole portion 134 may be formed. The second conductive layer may be an impurity doped polysilicon layer. The second conductive layer may be etched back, or polished, to form a second pad electrode 136 in the hole portion 134.

The second pad electrode 136 may be electrically insulated from the neighboring first pad electrode 116a in the first direction by the spacer 133.

The second pad electrodes 136 neighboring each other in the second direction may be electrically insulated by the spacer layer 132.

Figure 23:
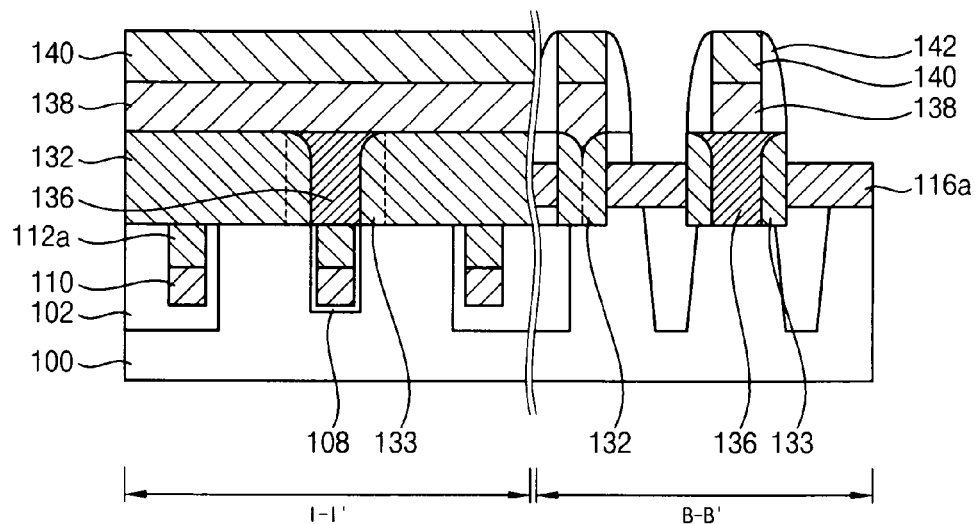

Referring to FIG. 23, a metal layer (not shown) and a hard mask layer (not shown) may be formed on the first pad electrode 116a, the insulating interlayer pattern 118a and the spacer layer 132. Particularly, the metal layer may be formed by depositing tungsten material. In addition, the hard mask layer may be formed by depositing silicon nitride.

Then, the hard mask layer may be patterned to form a hard mask pattern 140. In addition, the metal layer may be etched using the hard mask pattern 140 as an etching mask to form a metal pattern 138.

Through performing the above-described process, bit line structures 138 and 140 making a contact with the second pad electrode may be formed. The bit line structures 138 and 140 may have an integrated shape of the metal pattern 138 and the hard mask pattern 140 and may extend in the second direction.

At both side portions of the bit line structures 138 and 140, a spacer 142 may be formed.

Figure 24:
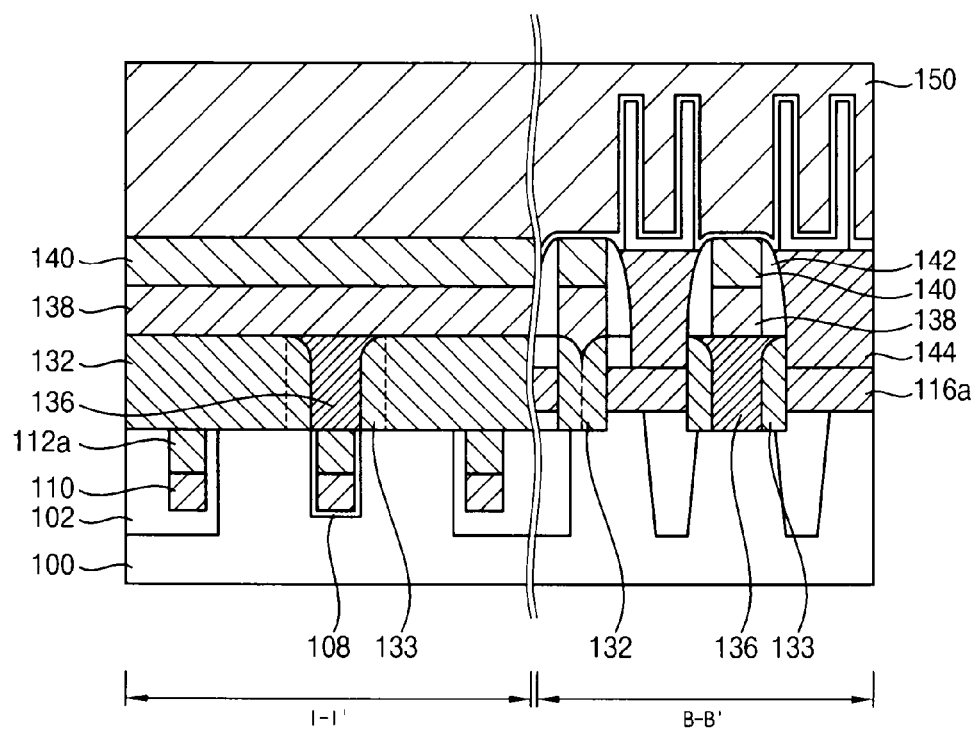

Referring to FIG. 24, a storage node contact 144 making an electric connection with the first pad electrode 116a may be formed. In addition, a capacitor 150 making an electric connection with the storage node contact 144 may be formed.

After performing the above processes, damage on the substrate in the active region making an electric connection with the capacitor may be reduced (or, alternatively, prevented). Accordingly, defects due to a contacting defect of the substrate in the active region with the capacitor may be reduced (or, alternatively, prevented). In addition, mis-alignment of the pad electrode for making an electric connection of the capacitor with the active region may be rarely generated. Accordingly, a decrease of a contacting area between the pad electrode and the active region due to the mis-alignment may be prevented.

Hereinafter, various application embodiments using the DRAM device in accordance with example embodiments may be explained. The DRAM device may be packaged to form a DRAM chip. Some embodiments among various applications of the embodiments of the chip are explained below.

Figure 25:
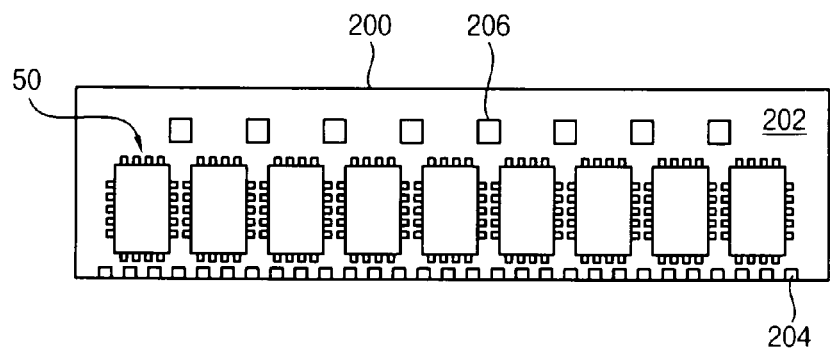

FIG. 25 is a plan view of a memory module including a DRAM chip having a DRAM device in accordance with yet another example embodiment.

Particularly, the integrated circuit semiconductor devices in accordance with example embodiments may be respectively packaged to form DRAM chips 50. The DRAM chips 50 may be applied in a memory module 200. The memory module 200 may include a module substrate 202 and DRAM chips 50 attached on the module substrate 202. In the memory module 200, an access portion 204 for inserting the memory module 200 into a socket of a mother board may be provided at a side, and ceramic decoupling capacitors 206 may be provided on the module substrate 202. The memory module 200 in accordance with example embodiments may be manufactured to have various shapes but not limited to the shaped illustrated in FIG. 25.

Figure 26:
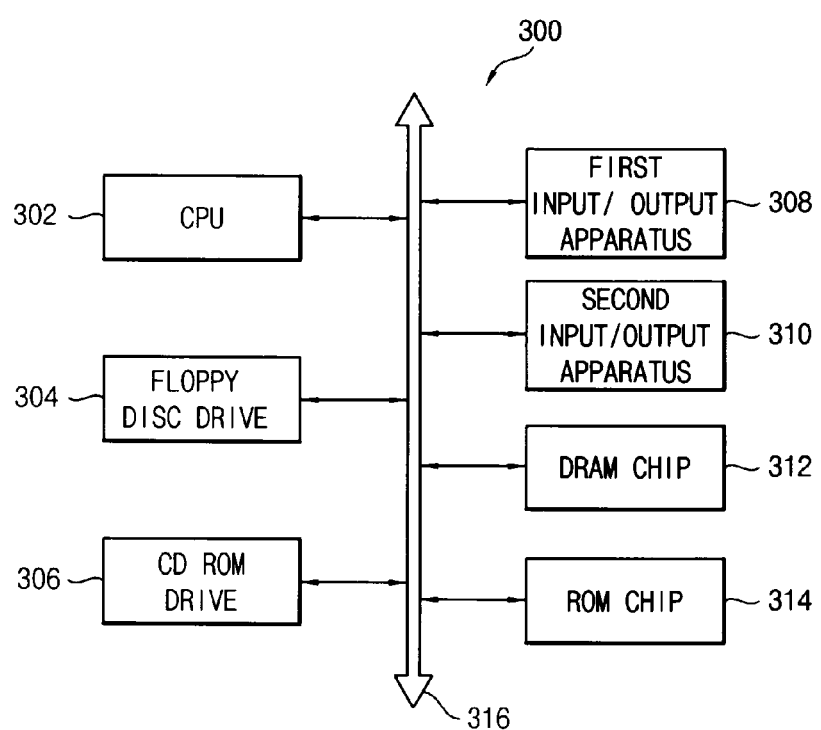

FIG. 26 is a block diagram of an electronic system including a DRAM chip having a DRAM device in accordance with still another example embodiment.

Particularly, an electronic system 300 in accordance with example embodiments may be a computer. The electronic system 300 may include a central processing unit (CPU) 302, a surrounding apparatus including a floppy disc drive 304 and a compact disc read only memory (CD ROM) drive 306, first and second input/output apparatuses 308 and 310, a DRAM chip 312, a ROM chip 314, etc. Each of the above described parts may exchange a control signal or data using a communication channel 316. The DRAM chip 312 may be replaced by the memory module 200 including the DRAM chips 50 as illustrated in FIG. 25.

As described above, a DRAM device including pad electrodes having a large contacting area with a substrate may be formed in accordance with example embodiments. Because damage of the substrate under the pad electrodes may be prevented, the DRAM device may have a high performance. The DRAM device may be applied to electronic appliances having a high performance including a memory system, a display system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings. Accordingly, all such modifications are intended to be included within the scope as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a dynamic random access memory (DRAM) device, comprising:

forming a buried-type gate in a substrate including at least one first pad region and at least one second pad region, the buried-type gate extending in a first direction;

forming a capping insulating layer pattern over the buried-type gate, the capping insulating layer pattern protruding from the substrate;

forming a conductive layer pattern filling up a gap between portions of the capping insulating layer pattern, the conductive layer pattern contacting a surface of the substrate;

forming an insulating interlayer over the conductive layer pattern and the capping insulating layer pattern;

etching the insulating interlayer, the conductive layer pattern, the capping insulating layer pattern and an upper portion of the substrate to form an opening extending in the first direction and to form a first pad electrode having an island shape, the first pad electrode contacting the first pad region of the substrate;

forming a first spacer on a sidewall of the opening such that a gap remains in an inner portion of the opening corresponding to the second pad region of the substrate and a remaining portion of the opening is completely filled;

forming a second pad electrode in the gap remaining in the inner portion of the opening;

forming a bit line electrically connected to the second pad electrode; and forming a capacitor electrically connected to the first pad electrode.

2. The method of manufacturing a DRAM device of claim 1, wherein the forming a buried-type gate comprises:
    forming a first mask pattern over the substrate;
    etching the substrate using the first mask pattern as an etching mask to form a trench;
    forming a gate insulating layer on an inner wall of the trench;
    forming a conductive layer over the gate insulating layer to fill up the trench; and
    etching the conductive layer to form the buried-type gate filling up a lower portion of the trench.

3. The method of manufacturing a DRAM device of claim 2, wherein the forming a capping insulating layer pattern comprises:
    forming a capping insulating layer over the buried-type gate to completely fill up a remaining portion of the trench;
    polishing the capping insulating layer to expose an upper surface of the first mask pattern and to form the capping insulating layer pattern; and
    removing the first mask pattern.

4. The method of manufacturing a DRAM device of claim 3, wherein the capping insulating layer is formed using a material having a different etching selectivity than the first mask pattern.

5. The method of manufacturing a DRAM device of claim 1, wherein,
    the opening has a line shape extending in the first direction, and
    the opening has a first width over a region of the substrate excluding the second pad region, and a second width greater than the first width over the second pad region of the substrate.

6. The method of manufacturing a DRAM device of claim 5, wherein the forming a first spacer comprises:
    forming a spacer layer filling up the opening over the region of the substrate excluding the second pad region and partially filling in the opening over the second pad region, the spacer layer having a hole partially exposing the second pad region of the substrate; and
    anisotropically etching the spacer layer.

7. The method of manufacturing a DRAM device of claim 6, wherein the spacer layer has a thickness greater than a half of the first width, and smaller than a half of the second width.

8. The method of manufacturing a DRAM device of claim 1, wherein the forming a first pad electrode comprises:
    forming a second mask pattern over the insulating interlayer, the second mask pattern extending in a second direction substantially perpendicular to the first direction, and the second mask pattern covering the first pad region and exposing the second pad region; and
    etching the insulating interlayer, the conductive layer pattern, the capping insulating layer pattern and an upper portion of the substrate by using the second mask pattern as an etching mask.

9. The method of manufacturing a DRAM device of claim 1, further comprising forming an active region on the substrate, the active region having an island shape, and the active region being at an angle other than 90 degrees with respect to the first direction.

10. The method of manufacturing a DRAM device of claim 1, wherein the forming a conductive layer pattern comprises:
    forming a conductive layer on the capping insulating layer pattern, the conductive layer filling up the gap between portions of the capping insulating layer pattern; and
    polishing the conductive layer to expose an upper surface of the capping insulating layer pattern.

11. The method of manufacturing a DRAM device of claim 10, wherein the conductive layer pattern includes a polysilicon material.

12. The method of manufacturing a DRAM device of claim 1, wherein an upper surface of the capping insulating layer pattern is equal to or higher than that of a target pad electrode to be formed.

13. The method of manufacturing a DRAM device of claim 1, wherein the first spacer includes silicon nitride.

14. The method of manufacturing a DRAM device of claim 9, wherein the active region includes first pad regions at both edge portions and a second pad region at a center portion in an extending direction of the active region.

15. The method of manufacturing a DRAM device of claim 1, wherein the forming a bit line comprises:
    forming a second conductive layer on the substrate including the first and second pad electrodes;
    forming a hard mask on the second conductive layer;
    etching the second conductive layer using the hard mask to form a bit line structure extending in a second direction substantially perpendicular to the first direction, the bit line structure contacting the second pad electrode; and
    forming a second spacer at both sides of the bit line structure.

16. A method of manufacturing a dynamic random access memory (DRAM) device, comprising:
    forming an insulated gate structure over a substrate, the insulated gate structure including a buried-type gate within the substrate, a first capping insulating layer pattern over the buried-type gate and partially recessed in the substrate, and a conductive layer pattern along sidewalls of the first capping insulating layer pattern, and the buried-type gate extending in a first direction;
    forming a preliminary first pad electrode and a second capping insulating layer pattern by etching the insulated gate structure and an upper portion of the substrate;
    forming a first pad electrode contacting a first pad region of the substrate by patterning the preliminary first pad electrode along a second direction substantially perpendicular to the first direction to expose a second pad region of the substrate;
    forming a spacer on sidewalls of the first pad electrode and the second capping insulating layer pattern and partially over the exposed second pad region such that a portion of the second pad region remains exposed;
    forming a second pad electrode over the exposed portion of the second pad region, the first pad electrode being isolated from the second pad electrode;
    forming a bit line structure electrically connected to the second pad electrode; and
    forming a capacitor electrically connected to the first pad electrode.

17. The method of claim 16, wherein the first pad region and the second pad region are alternately arranged along the first direction.

18. The method of claim 16, wherein forming the first pad electrode comprises forming an opening portion extending in the second direction, the opening portion has a first width over a region of the substrate excluding the second pad region and a second width over the second pad region, the second width being greater than the first width, and the first and the second widths of the opening portion extend in the first direction.

19. The method of claim 18, wherein forming the spacer comprises, forming a spacer layer along a sidewall of the opening portion and on an upper surface of the substrate, the spacer layer exposing the portion of the second pad region; and etching the spacer layer to form the spacer, the spacer covering the region of the substrate excluding the second pad region and partially covering the second pad region.

20. The method of claim 16, wherein the conductive layer pattern is shaped as a line extending in the first direction.

* * * * *